(12) United States Patent
Lee et al.

(10) Patent No.: US 10,755,989 B2
(45) Date of Patent: Aug. 25, 2020

(54) SEMICONDUCTOR SUBSTRATE MANUFACTURING METHOD

(71) Applicant: SK SILTRON CO., LTD., Gumi-si, Gyeongsangbuk-do (KR)

(72) Inventors: Kyung Sun Lee, Gumi-si (KR); Ho Chan Ham, Gumi-si (KR)

(73) Assignee: SK SILTRON CO., LTD., Seoul (KR)

( * ) Notice: Subject to any disclaimer, the term of this patent is extended or adjusted under 35 U.S.C. 154(b) by 0 days.

(21) Appl. No.: 16/465,494

(22) PCT Filed: Nov. 28, 2017

(86) PCT No.: PCT/KR2017/013636
§ 371 (c)(1),
(2) Date: May 30, 2019

(87) PCT Pub. No.: WO2018/105935
PCT Pub. Date: Jun. 14, 2018

(65) Prior Publication Data
US 2020/0066605 A1      Feb. 27, 2020

(30) Foreign Application Priority Data
Dec. 5, 2016   (KR) .................... 10-2016-0164552

(51) Int. Cl.
*H01L 21/00* (2006.01)
*H01L 21/66* (2006.01)
(Continued)

(52) U.S. Cl.
CPC ........ *H01L 22/12* (2013.01); *H01L 21/02043* (2013.01); *H01L 21/02236* (2013.01);
(Continued)

(58) Field of Classification Search
CPC ... H01L 22/24; H01L 21/324; H01L 21/3212; H01L 21/0257; H01L 21/02043;
(Continued)

(56) References Cited

U.S. PATENT DOCUMENTS 6,277,193 B1    8/2001   Sadamitsu et al.
9,484,273 B2 *  11/2016  Lee ..................... H01L 21/6708
(Continued)

FOREIGN PATENT DOCUMENTS

JP       2016-178122        10/2016
KR    10-2000-0057350        9/2000
(Continued)

OTHER PUBLICATIONS

International Search Report (with English Translation) and Written Opinion dated Mar. 20, 2018 issued in Application No. PCT/KR2017/013636.

*Primary Examiner* — Nikolay K Yushin
(74) *Attorney, Agent, or Firm* — Ked & Associates LLP

(57) ABSTRACT

A semiconductor substrate manufacturing method according to an embodiment comprises the steps of: contaminating at least one of a surface layer of a doped semiconductor substrate having a specific resistance of less than 0.1 Ω·cm and a bulk layer below the surface layer with at least one metal of Fe, Cu, and Ni; performing dry oxidation at 950° C. for 30 minutes to forcibly form an oxide film on the surface of the semiconductor substrate; and assessing at least one of the presence and the degree of contamination of metal contained in at least one of the oxide film-formed surface layer and bulk layer by using a photoluminescence assessment method.

13 Claims, 18 Drawing Sheets

(51) Int. Cl.
  *H01L 21/02* (2006.01)
  *H01L 21/223* (2006.01)
  *H01L 21/304* (2006.01)
  *H01L 21/324* (2006.01)
  *G01N 21/64* (2006.01)

(52) U.S. Cl.
  CPC .......... *H01L 21/223* (2013.01); *H01L 21/304* (2013.01); *H01L 21/324* (2013.01); *G01N 21/6489* (2013.01)

(58) Field of Classification Search
  CPC ................ H01L 21/223; H01L 21/304; H01L 21/02554; H01L 21/02005; H01L 21/02236; H01L 22/12; H01L 22/20; H01L 22/10; G01N 21/6489; G01N 21/9501; G01N 21/76; G01N 21/253; G01N 21/66; G01N 21/645
  See application file for complete search history.

(56) References Cited

U.S. PATENT DOCUMENTS

2006/0205197 A1\* 9/2006 Yi ...................... H01L 21/0237
 438/590
2012/0260750 A1 10/2012 Lee

FOREIGN PATENT DOCUMENTS

| KR | 10-2007-0065730 | 6/2007 |
| KR | 10-2012-0107190 | 10/2012 |
| KR | 10-2015-0033433 | 4/2015 |

\* cited by examiner

FIG. 11

|  | SURFACE LAYER ||| BULK LAYER |||
| TIME / TEMPERATURE | 30min | 60min | 120min | 30min | 60min | 120min |
|---|---|---|---|---|---|---|
| 950C° | | | | | | |
| 1000C° | | | X | | | |
| 1050C° | | X | X | | | X |

FIG. 12

|  | SURFACE LAYER ||| BULK LAYER |||
| TIME / TEMPERATURE | 30min | 60min | 120min | 30min | 60min | 120min |
|---|---|---|---|---|---|---|
| 950°C | | | | | | |
| 1000°C | | | X | | | |
| 1050°C | | X | X | | | X |

SEMICONDUCTOR SUBSTRATE MANUFACTURING METHOD

CROSS-REFERENCE TO RELATED PATENT APPLICATIONS

This application is a U.S. National Stage Application under 35 U.S.C. § 371 of PCT Application No. PCT/KR2017/013636, filed Nov. 28, 2017, which claims priority to Korean Patent Application No. 10-2016-0164552, filed Dec. 5, 2016, whose entire disclosures are hereby incorporated by reference.

TECHNICAL FIELD

Embodiments relate to a semiconductor substrate manufacturing method.

BACKGROUND ART

When a semiconductor substrate is manufactured, the result of evaluation of the semiconductor substrate may be usefully used. There is a photoluminescence (PL) evaluation method, as an example of a semiconductor substrate evaluation method. In the PL evaluation method, excitation light is radiated to the surface of a semiconductor substrate, and light generated when electron/hole pairs, excited by the excitation light, are recombined is detected in order to obtain information about the quality of the semiconductor substrate, for example, information about various crystalline defects, such as metal contamination or defects in the semiconductor substrate.

In the convention PL evaluation method, however, surface recombination loss occurs due to external contamination of the semiconductor substrate and the processed state of the semiconductor substrate, whereby it is not possible to accurately evaluate whether the semiconductor substrate is contaminated or the degree of contamination.

Also, in the case in which the semiconductor substrate is doped at a high concentration, the intensity of light detected using the PL evaluation method is high, whereby it is not possible to accurately evaluate whether metal contamination is present in the semiconductor substrate and the degree of metal contamination.

DISCLOSURE

Technical Problem

Embodiments provide a semiconductor substrate manufacturing method that is capable of accurately and easily evaluating information related to at least one of whether metal contamination is present in a semiconductor substrate or the degree of metal contamination.

Technical Solution

In one embodiment, a semiconductor substrate manufacturing method may include (a) contaminating at least one of a surface layer or a bulk layer, which is located under the surface layer, of a semiconductor substrate with at least one metal of Fe, Cu, or Ni, (b) forcibly forming an oxide film on the surface of the semiconductor substrate, and (c) evaluating at least one of whether metal contamination is present in at least one of the surface layer, on which the oxide film is formed, or the bulk layer or the degree of metal contamination, using a photoluminescence evaluation method.

For example, the semiconductor substrate manufacturing method may further include evaluating at least one of whether metal contamination is present in the semiconductor substrate or the degree of metal contamination using u-PCD and checking the correlation between the result of evaluation using the photoluminescence evaluation method and the result of evaluation using the u-PCD.

For example, the step of forming the oxide film may be performed through dry oxidation. For example, the dry oxidation may be performed at a temperature of 950° C. to 1050° C. for 30 minutes to 120 minutes. The dry oxidation may be performed at a temperature of 950° C. for 30 minutes.

For example, the (a) contaminating the surface layer with the metal may include contaminating at least two points, located at the edge of the semiconductor substrate so as to be spaced apart from each other, and at least two points, located at the central portion of the semiconductor substrate inside the edge thereof so as to be spaced apart from each other, with the metal.

For example, the (a) contaminating the bulk layer with the metal may include contaminating a plurality of points, located at the surface of the central portion of the semiconductor substrate inside the edge thereof so as to be spaced apart from each other, with the metal, performing diffusion heat treatment in order to diffuse the metal contaminant, present at the surface, into the bulk of the semiconductor substrate, and polishing the surface of the semiconductor substrate after the diffusion.

For example, the semiconductor substrate may include a p-type or n-type doped wafer.

For example, the doped wafer may have a specific resistance of 0.005 Ω·cm to 0.02 Ω·cm.

For example, the doped wafer may have a specific resistance of 10 Ω·cm to 20 Ω·cm.

For example, the dry oxidation may be performed at a temperature of 950° C. for 30 minutes and 60 minutes or a temperature of 1000° C. for 30 minutes in order to form the oxide film so as to have a thickness of 200 Å to 500 Å at step (b), and the surface layer of the semiconductor substrate may be evaluated at step (c).

For example, the dry oxidation may be performed at a temperature of 950° C. for 30 minutes in order to form the oxide film at step (b), and Fe contamination in the bulk layer of the semiconductor substrate may be evaluated at step (c).

For example, the dry oxidation may be performed at respective temperatures of 950° C. and 1000° C. for 30 minutes and 60 minutes in order to form the oxide film so as to have a thickness of 200 Å to 600 Å at step (b), and the surface layer may be evaluated at step (c). The dry oxidation may be performed at a temperature of 950° C. for 30 minutes.

For example, at step (c), the wavelength of excitation light radiated to the semiconductor substrate in order to evaluate the surface layer may be 532 nm, and the wavelength of excitation light radiated to the semiconductor substrate in order to evaluate the bulk layer may be 827 nm.

For example, the surface layer may be a first area from the surface to a depth of the semiconductor substrate spaced apart from the surface by turn, and the bulk layer may be a second area from the surface to a depth of the semiconductor substrate spaced apart from the surface by 10 μm to 30 μm.

For example, the semiconductor substrate may include a polished wafer, which is formed by mirror surface grinding, or an epitaxial wafer having an epitaxial layer formed thereon. In addition, the semiconductor substrate may include a single crystalline silicon wafer, a polycrystalline silicon wafer, or a compound semiconductor wafer.

In another embodiment, a semiconductor substrate manufacturing method may include (a) contaminating at least one of a surface layer or a bulk layer, which is located under the surface layer, of a doped semiconductor substrate having a specific resistance of 0.1 Ω·cm or less with at least one metal of Fe, Cu, or Ni, (b) performing dry oxidation at a temperature of 950° C. for 30 minutes in order to forcibly form an oxide film on the surface of the semiconductor substrate, and (c) evaluating at least one of whether metal contamination is present in at least one of the surface layer, on which the oxide film is formed, or the bulk layer or the degree of metal contamination using a photoluminescence evaluation method.

For example, the specific resistance of the semiconductor substrate to be contaminated with the metal at step (a) may be 0.005 Ω·cm to 0.02 Ω·cm.

For example, the semiconductor substrate to be contaminated with the metal at step (a) may include a polished wafer, which is formed by mirror surface grinding, or an epitaxial wafer, which has an epitaxial layer formed on the polished wafer.

For example, the semiconductor substrate to be contaminated with the metal at step (a) may include a single crystalline silicon wafer, a polycrystalline silicon wafer, or a compound semiconductor wafer.

For example, the semiconductor substrate to be contaminated with the metal at step (a) may be an n-type or p-type doped substrate.

For example, the (a) contaminating the surface layer with the metal may include contaminating at least two points, located at the edge of the semiconductor substrate so as to be spaced apart from each other, and at least two points, located at the central portion of the semiconductor substrate inside the edge thereof so as to be spaced apart from each other, with the metal.

For example, the (a) contaminating the bulk layer with the metal may include contaminating a plurality of points, located at the surface of the central portion of the semiconductor substrate inside the edge thereof so as to be spaced apart from each other, with the metal, performing diffusion heat treatment in order to diffuse the metal contaminant, present at the surface, into the bulk of the semiconductor substrate, and polishing the surface of the semiconductor substrate after the diffusion.

For example, step (b) may be performed after removing a natural oxide film formed on the surface of the semiconductor substrate. Alternatively, step (b) may be performed in the state in which a natural oxide film is formed on the surface of the semiconductor substrate.

For example, the oxide film may be formed so as to have a thickness of 200 Å to 500 Å at step (b), and the surface layer of the semiconductor substrate may be evaluated at step (c).

For example, Fe contamination in the bulk layer of the semiconductor substrate may be evaluated at step (c).

For example, at step (c), the wavelength of excitation light radiated to the semiconductor substrate in order to evaluate the surface layer may be 532 nm, and the wavelength of excitation light radiated to the semiconductor substrate in order to evaluate the bulk layer may be 827 nm.

For example, the surface layer may be a first area from the surface to a depth of the semiconductor substrate spaced apart from the surface by 1 μm, and the bulk layer may be a second area from the surface to a depth of the semiconductor substrate spaced apart from the surface by 10 μm to 30 μm.

Advantageous Effects

A semiconductor substrate manufacturing method according to an embodiment is capable of accurately and easily evaluating at least one of whether a semiconductor substrate is contaminated with a metal or the degree of metal contamination. In particular, the semiconductor substrate manufacturing method is capable of accurately and easily evaluating at least one of whether a lightly-doped semiconductor substrate as well as a heavily-doped semiconductor substrate is contaminated with a metal or the degree of metal contamination.

DESCRIPTION OF DRAWINGS

FIG. 11 shows a PL map of a semiconductor substrate heavily doped with boron;

FIG. 12 shows a PL map of a semiconductor substrate lightly doped with boron;

FIG. 19a is a map showing correlation between a first evaluation result and a second evaluation result while

BEST MODE

Reference will now be made in detail to preferred embodiments, examples of which are illustrated in the accompanying drawings. However, the embodiments may be modified into various other forms. The embodiments are not restrictive but are illustrative. The embodiments are provided to more completely explain the disclosure to a person having ordinary skill in the art.

Figure 1:
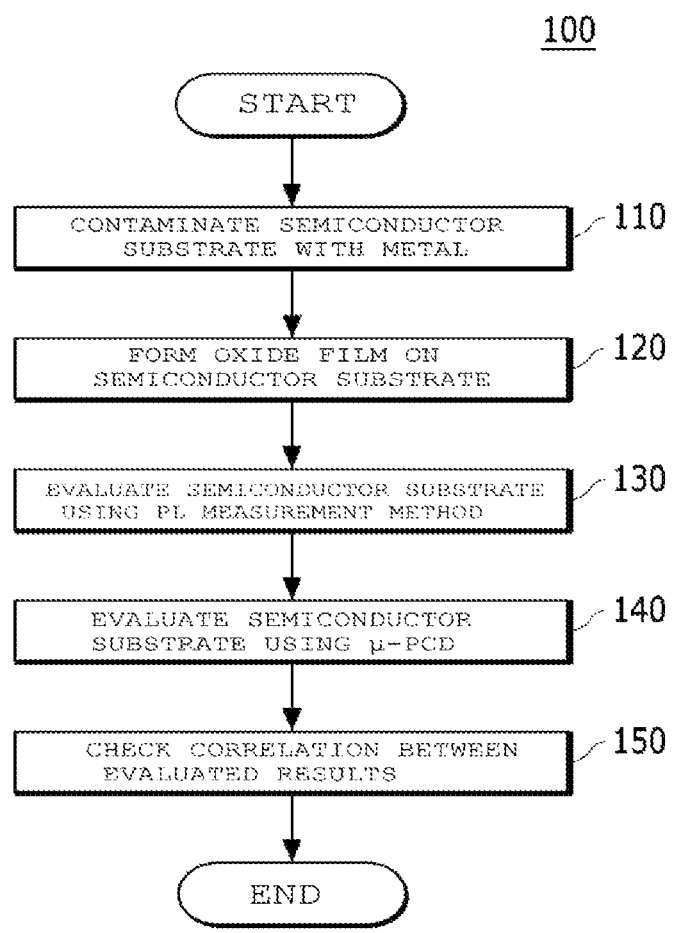
FIG. 1 is a flowchart illustrating a semiconductor substrate manufacturing method according to an embodiment.

FIG. 1 is a flowchart illustrating a semiconductor substrate manufacturing method 100 according to an embodiment.

Referring to FIG. 1, at least one of a surface layer or a bulk layer of a semiconductor substrate is contaminated using metal (step 110).

Figure 2:
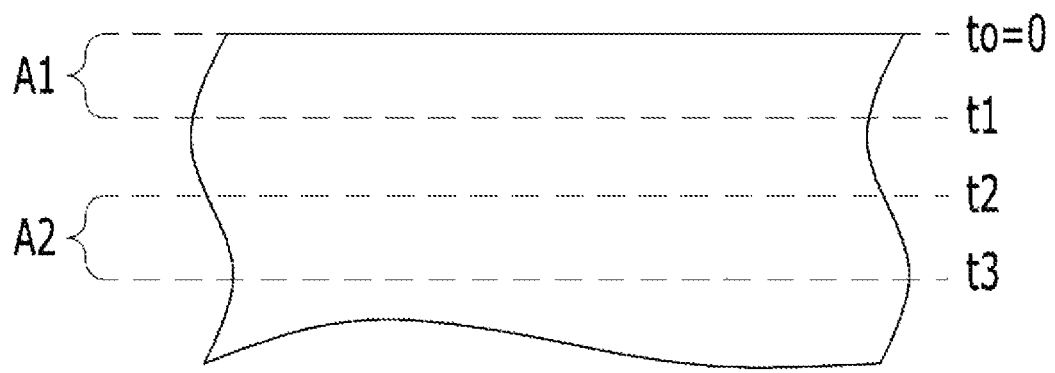
FIG. 2 is an exemplary sectional view of a semiconductor substrate provided to help understanding of the semiconductor substrate manufacturing method shown in FIG. 1.

FIG. 2 is an exemplary sectional view of a semiconductor substrate provided to help understanding of the semiconductor substrate manufacturing method 100 shown in FIG. 1.

Referring to FIG. 2, the surface layer of the semiconductor substrate may be defined as a first area A1 from the surface t0 to a first depth t1 of the semiconductor substrate. For example, the first depth t1 may be 1 μm. However, embodiments are not limited thereto.

The bulk layer of the semiconductor substrate may be located under the surface layer, and may be defined as a second area A2 from a second depth t2, which is spaced apart from the surface t0 of the semiconductor substrate, to a third depth t3 of the semiconductor substrate. For example, the second depth t2 may be 10 μm, and the third depth t3 may be 30 μm. However, embodiments are not limited thereto.

In another embodiment, the bulk layer may be an area from the first depth t1, which is spaced apart from the surface t0 by 1 μm, to the third depth t3 of the semiconductor substrate, which is spaced apart from the surface t0 by 30 μm.

At step 110, the metal that contaminates the semiconductor substrate may include at least of Fe, Cu, or Ni.

According to this embodiment, the semiconductor substrate may include a polished wafer, which is formed by mirror surface grinding, or an epitaxial wafer, which has an epitaxial layer formed on the polished wafer.

In addition, the semiconductor substrate may include a single crystalline silicon wafer, a polycrystalline silicon wafer, or a compound semiconductor wafer.

In addition, the semiconductor substrate may include a wafer doped with a p-type or n-type dopant. For example, the semiconductor substrate may be a wafer doped at a high concentration or a low concentration. Hereinafter, a wafer doped at a high concentration may mean a wafer having a specific resistance of 0.1 Ω·cm or less, for example, 0.005 Ω·cm to 0.02 Ω·cm, and a wafer doped at a low concentration may mean a wafer having a specific resistance of 10 Ω·cm to 20 Ω·cm. However, embodiments are not limited to particular values of the specific resistance.

In the case in which the semiconductor substrate is an n-type doped wafer, the semiconductor substrate may include Si, Ge, Sn, Se, or Te as an n-type dopant. However, embodiments are not limited thereto. Also, in the case in which the semiconductor substrate is a p-type doped wafer, the semiconductor substrate may include Mg, Zn, Ca, Sr, Ba, or B as a p-type dopant. However, embodiments are not limited thereto.

In addition, the diameter of the semiconductor substrate may be 200 mm, 300 mm, or 450 mm.

However, embodiments are not limited as to the specific kind of the semiconductor substrate.

Figure 3:
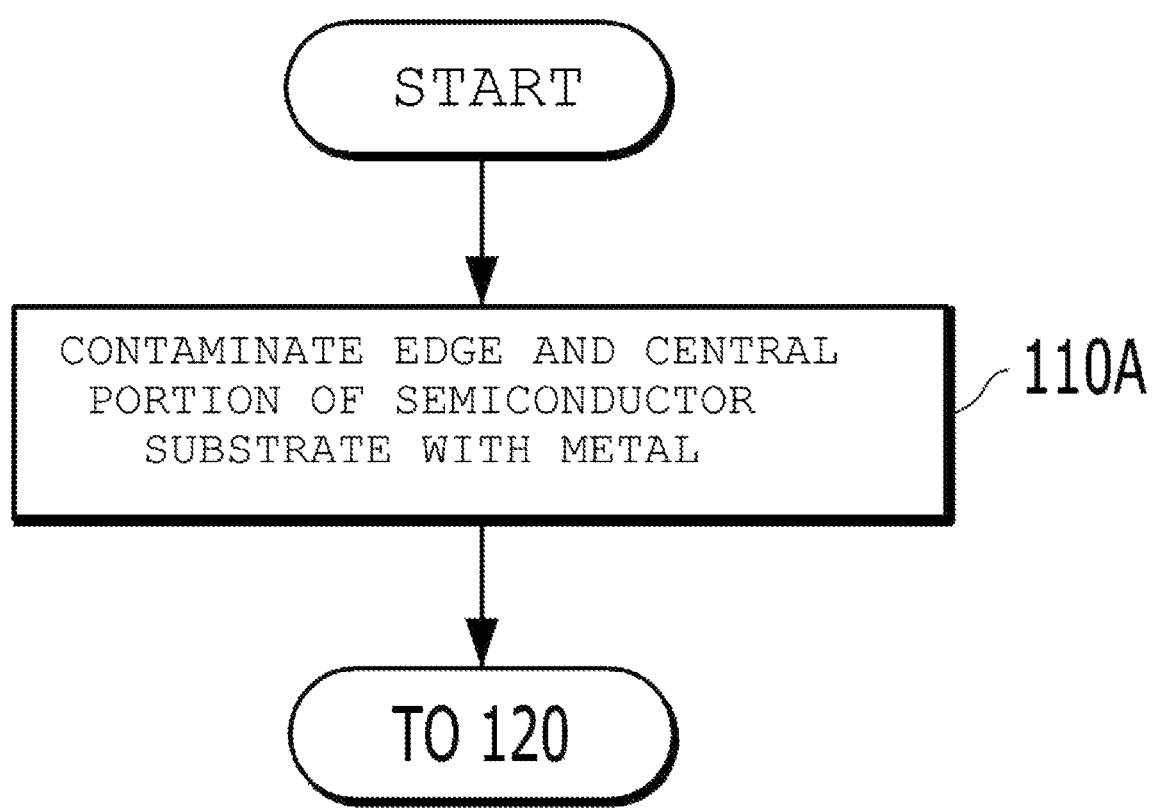
FIG. 3 is a flowchart illustrating an embodiment of step 110 shown in FIG. 1.

FIG. 3 is a flowchart illustrating an embodiment 110A of step 110 shown in FIG. 1.

Figure 4:
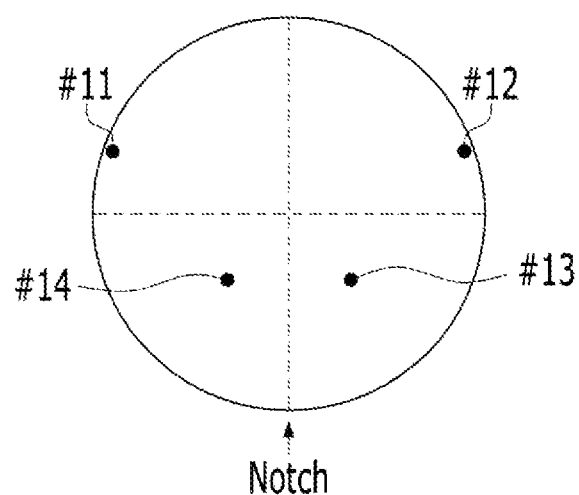
FIG. 4 is a plan view of a semiconductor substrate illustrating metal contamination of a surface layer of the semiconductor substrate.

FIG. 4 is a plan view of a semiconductor substrate illustrating metal contamination of a surface layer of the semiconductor substrate. In FIG. 4, "Notch" indicated by the arrow indicates a point at which a notch is present.

Referring to FIGS. 3 and 4, at least two points located at the edge of the semiconductor substrate so as to be spaced apart from each other (for example, #11 and #12) and at least two points located at the central portion of the semiconductor substrate inside the edge thereof so as to be spaced apart from each other (for example, #13 and #14) may be contaminated with a metal in order to contaminate a surface layer A1 of the semiconductor substrate with the metal (step 110).

Figure 5:
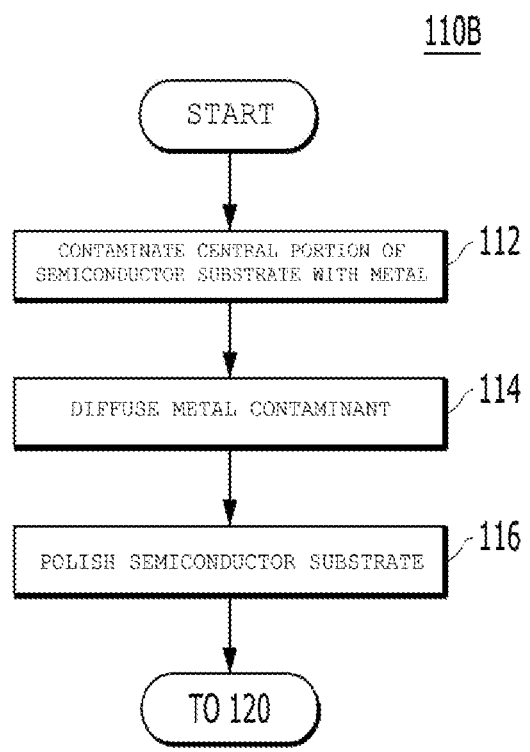
FIG. 5 is a flowchart illustrating another embodiment of step 110 shown in FIG. 1.

FIG. 5 is a flowchart illustrating another embodiment 110B of step 110 shown in FIG. 1.

Figure 6:
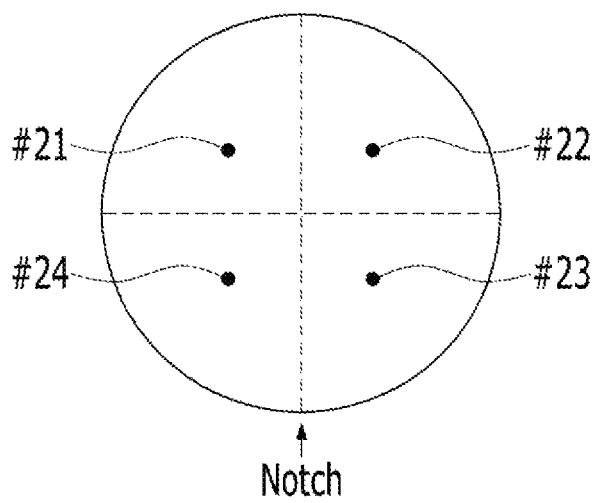
FIG. 6 is a plan view of a semiconductor substrate illustrating metal contamination of a bulk layer.

FIG. 6 is a plan view of a semiconductor substrate illustrating metal contamination of a bulk layer.

Referring to FIGS. 5 and 6, a plurality of points located at the surface of the central portion of the semiconductor substrate inside the edge thereof so as to be spaced apart from each other (for example, #21 to #24) is contaminated with a metal in order to contaminate a bulk layer A2 of the semiconductor substrate with the metal (step 112).

After step 112, high-temperature furnace diffusion heat treatment is performed in order to diffuse the metal contaminant, present at the surface of the semiconductor substrate, into the bulk of the semiconductor substrate (step 114).

After step 114, the surface of the semiconductor substrate is polished (step 116). At step 116, the surface of the semiconductor substrate may be polished in order to remove the surface layer contamination, whereby only the bulk layer contamination may be evaluated at step S130, a description of which will follow.

For example, contamination levels due to the respective metals at the respective points shown in FIG. 4 or 6 are shown in Table 1 below.

TABLE 1

| Classification | Point | Cu | Ni | Fe | Ref. |
|---|---|---|---|---|---|
| Contamination level (ppb) | #1 | 1000 | 1000 | 100 | No metal contamination |
|  | #2 | 100 | 100 | 10 |  |
|  | #3 | 10 | 10 | 1 |  |
|  | #4 | 1 | 1 | 0.05 |  |

Here, #1 means #11 or #21, #2 means #12 or #22, #3 means #13 or #23, and #4 means #14 or #24.

Referring back to FIG. 1, after step 110, an oxide film is forcibly formed on the surface of the semiconductor substrate (step 120). Here, a natural oxide film may be formed on the surface of the semiconductor substrate. Here, forcibly forming the oxide film may mean intentionally forming an oxide film on the surface of the semiconductor substrate, other than the natural oxide film.

In addition, step 120 may be performed after removing the natural oxide film.

Alternatively, step 120 may be performed without removing the natural oxide film. In this case, an oxide film may be forcibly formed on the natural oxide film.

According to this embodiment, at step 120, an oxide film may be formed on the semiconductor substrate through wet oxidation or dry oxidation. For uniformity in the thickness of the oxide film and smooth adjustment of process conditions, the oxide film may be formed through dry oxidation, rather than through wet oxidation.

After step 120, at least one of whether defects or metal contamination is present in at least one of the surface layer or the bulk layer of the semiconductor substrate having the oxide film formed thereon or the degree of metal contamination may be evaluated using a photoluminescence (PL) evaluation method (step 130). Here, the "defects" may be defects due to metal contamination, and the "metal contamination" may be contamination due to a metal.

For example, the dry oxidation may be performed at a temperature of 950° C. to 1050° C. for 30 to 120 minutes.

In general, an electrical property evaluation method is used as a method of evaluating crystalline defects and metal contamination of a silicon wafer or an epitaxial wafer. A PL evaluation method, which is an example of the electrical property evaluation method, detects the light emitted from a semiconductor substrate due to recombination thereof using excitation light and evaluates the semiconductor substrate using the detected light. It is difficult to measure an indirect band gap material, such as silicon (Si), at room temperature (RT). However, the PL evaluation method may be used at room temperature, and may detect metal contamination and whether defects is present using only the intensity of light at a wavelength of 1.1 eV, which corresponds to the band gap energy of silicon. For example, the semiconductor substrate may be variously evaluated using the PL evaluation method, an example of which is exemplarily disclosed in Japanese Patent Application Publication No. 2011-54691, and therefore a specific description of a PL evaluation device or method will be omitted.

For example, the wavelength of excitation light radiated to the semiconductor substrate in order to evaluate the surface layer of the semiconductor substrate may be 532 nm, and the wavelength of excitation light radiated to the semiconductor substrate in order to evaluate the bulk layer of the semiconductor substrate may be 827 nm. However, embodiments are not limited to specific excitation light wavelengths.

At step 120, the temperature and time of the dry oxidation may be changed depending on whether the semiconductor substrate is doped at a low concentration or a high concentration and on whether to evaluate the surface layer or the bulk layer of the semiconductor substrate.

First, the relationship between the temperature and time of the dry oxidation and the thickness of the oxide film and the relationship between the thickness of the oxide film and PL intensity of the semiconductor substrate in the case in which the semiconductor substrate is not contaminated with the metal will be described with reference to FIGS. 7 to 10. Here, "PL intensity" may mean the detected intensity of light emitted from the semiconductor substrate after excitation light is radiated to the semiconductor substrate using the PL evaluation method.

Figure 7:
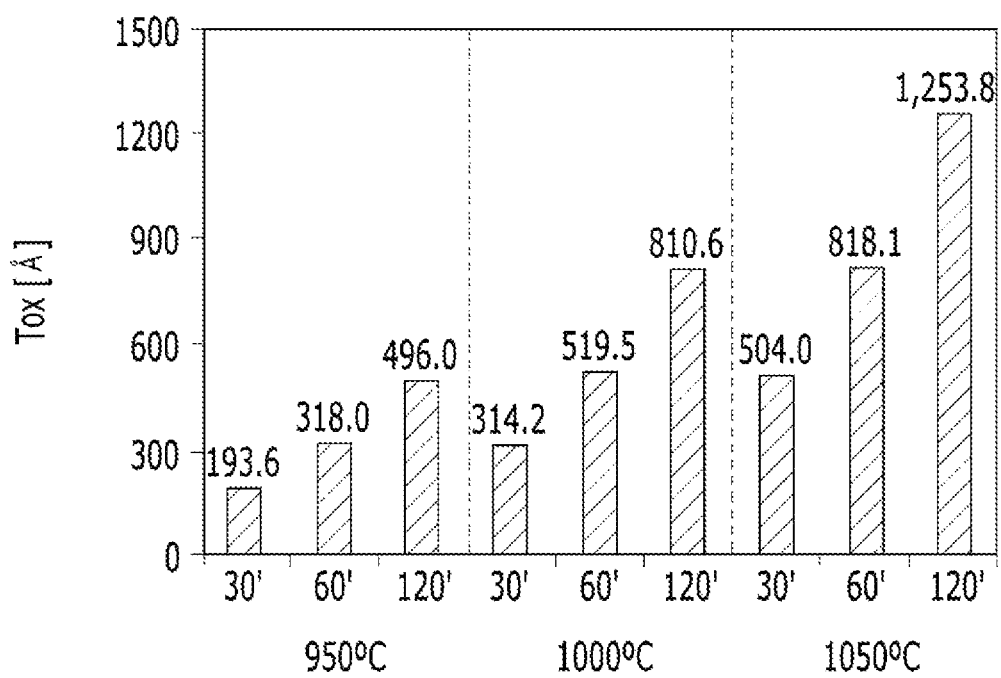
FIG. 7 is a graph exemplarily showing a change in the thickness of an oxide film depending on the temperature and time of dry oxidation.

FIG. 7 is a graph exemplarily showing a change in the thickness Tox of the oxide film depending on the temperature and time of the dry oxidation, wherein the horizontal axis indicates temperature and time and the vertical axis indicates the thickness of the oxide film. Here, the number shown at the upper end of each bar graph indicates the thickness of the oxide film.

Referring to FIG. 7, it can be seen that the thickness of the oxide film increases as the temperature and time of dry oxidation are increased. Consequently, it can be seen that it is possible to flexibly vary the thickness of the oxide film by adjusting the temperature and time of the dry oxidation, rather than fixing the thickness of the oxide film.

Figure 8:
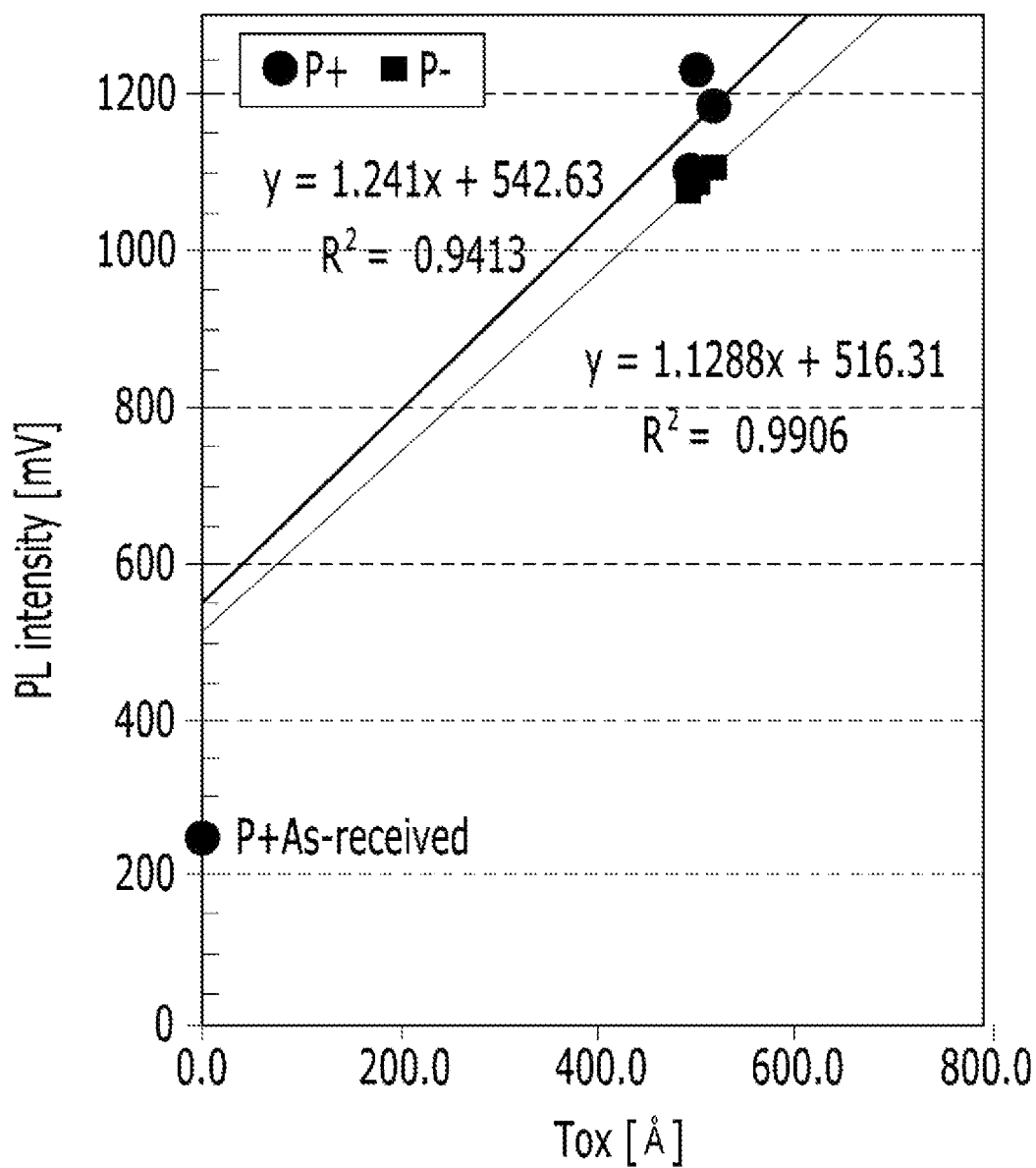
FIG. 8 shows PL intensity at a surface layer of a semiconductor substrate depending on the thickness of an oxide film.
Figure 9:
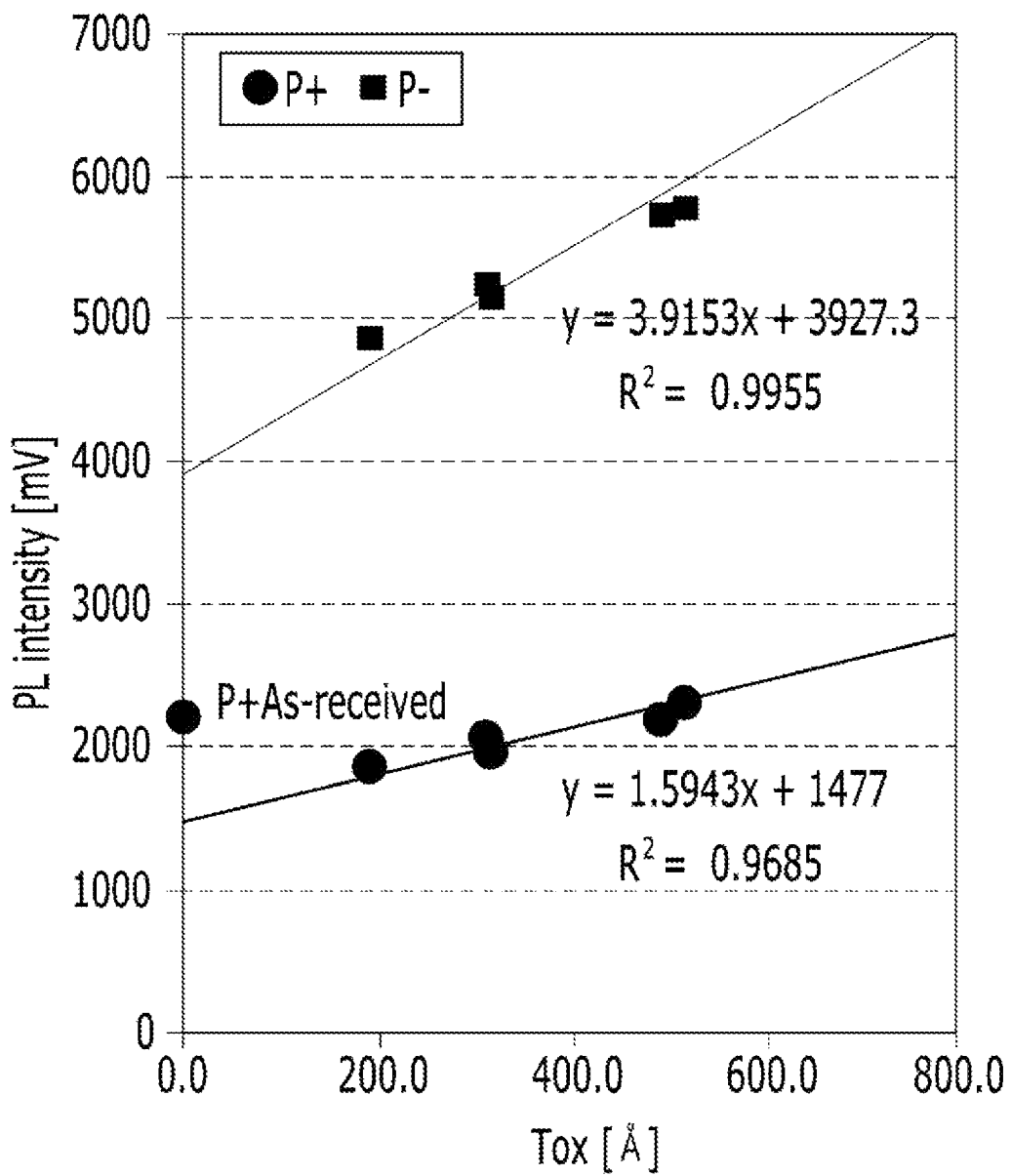
FIG. 9 shows PL intensity at a bulk layer of a semiconductor substrate depending on the thickness of an oxide film.
Figure 10:
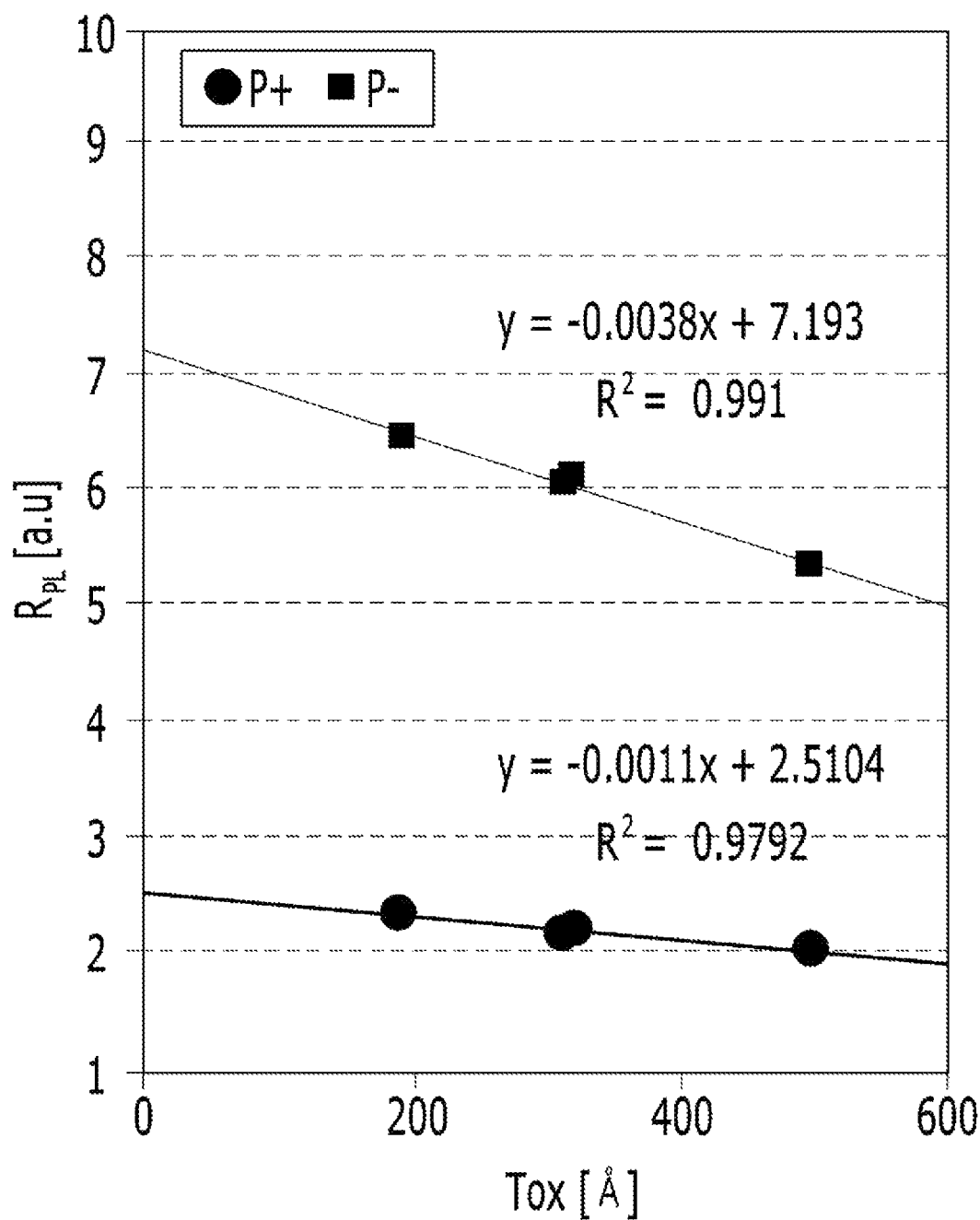
FIG. 10 shows a ratio between PL intensities.

In each of FIG. 8 and FIG. 9, "x" means "Tox" and "y" means "PL intensity." Also, in FIG. 10, "x" means "Tox" and "y" means "$R_{PL}$". Also, in each of FIGS. 8 to 10, "$R^2$" means the coefficient of correlation representing the correlationship between "x" and "y". FIG. 8 shows PL intensity at the surface layer of the semiconductor substrate depending on the thickness of the oxide film FIG. 8 shows the results measured when the surface layer is the first area A1 from the surface t0 to the first depth t1, which is spaced apart from the surface t0 by 1 μm, in FIG. 2.

FIG. 9 shows PL intensity at the bulk layer of the semiconductor substrate depending on the thickness of the oxide film. FIG. 9 shows the results measured when the bulk layer is the second area A2 from the second depth t2, which is spaced apart from the surface t0 by 20 μm, to the third depth t3 of the semiconductor substrate, which is spaced apart from the surface t0 by 30 μm, in FIG. 2.

FIG. 10 shows a ratio RPL between PL intensities.

FIGS. 8 to 10 show the case (P−) in which the semiconductor substrate is lightly doped with a p-type dopant and the case (P+) in which the semiconductor substrate is heavily doped with a p-type dopant. In addition, FIGS. 8 to 10 show the results acquired using the PL evaluation method when excitation light radiated to the semiconductor substrate is emitted from a laser diode. FIG. 8 shows the results acquired when the wavelength of the excitation light is 532 nm, and FIG. 9 shows the results acquired when the wavelength of the excitation light is 827 nm. In FIGS. 8 and 9, "P+ As-received" indicates the PL intensity when no oxide film is formed on the semiconductor substrate.

The ratio RPL between PL intensities shown in FIG. 10 may be expressed using Equation 1 below.

$$R_{PL} = \frac{I_{PL}(827)}{I_{PL}(532)} \qquad \text{Equation 1}$$

Here, IPL(827) indicates PL intensity at the bulk layer, and IPL(532) indicates PL intensity at the surface layer. In addition, each of IPL(827) and IPL(532) indicates PL intensity over the entire semiconductor substrate.

Referring to FIGS. 8 and 9, it can be seen that, when the semiconductor substrate is not contaminated with the metal, PL intensities at the surface layer and the bulk layer increase as the thickness of the oxide film increases.

Particularly referring to FIG. 10, it can be seen that PL intensity at the surface layer increases depending on the thickness of the oxide film, whereby the ratio RPL of PL intensity at the bulk layer to PL intensity at the surface layer decreases.

Hereinafter, PL maps at the surface layer and the bulk layer of the semiconductor substrate depending on the temperature and time of dry oxidation when the semiconductor substrate is not contaminated with the metal will be described with reference to FIGS. 11 and 12 as attached.

FIG. 11 shows a PL map of a semiconductor substrate heavily doped with boron, and FIG. 12 shows a PL map of a semiconductor substrate lightly doped with boron.

The definitions of the surface layer and the bulk layer and the kind and wavelength of the light source in FIGS. 11 and 12 are the same as those applied in FIGS. 8 and 9, and a duplicate description thereof will be omitted.

Referring to FIGS. 11 and 12, it can be seen that, when the temperature and time of the dry oxidation process are 1000° C. and 120 minutes, which is longer than 60 minutes, and when the temperature and time of the dry oxidation process are 1050° C. and 60 and 120 minutes, the thickness of the oxide film becomes 500 Å or more, whereby it is not possible to evaluate the surface layer using the PL evaluation method.

In addition, referring to FIG. 12, it can be seen that, when the time is 60 minutes or more at each temperature, circular patterns, assumed to indicate precipitation, are generated, as indicated by the arrows.

Eventually, in the case in which the oxide film is formed by deposition through the dry oxidation, precipitation may occur due to oxygen mixed during ingot growing at a high temperature of 900° C. or higher. Consequently, the temperature and time of the dry oxidation process in which no precipitation occurs may be 950° C. and 30 minutes. However, embodiments are not limited thereto.

Hereinafter, the relationship between the temperature and time of the drying oxidation process and the thickness of the oxide film and PL intensity after the semiconductor substrate is contaminated with the metal will be described with reference to FIGS. 13 to 18c. Here, the points of the surface layer and the bulk layer that are contaminated with the metal are the same as those shown in FIGS. 4 and 6, and the surface layer and the bulk layer of the semiconductor substrate were contaminated with metals having four different levels, as shown in Table 1. Particularly, in order to check the sensitivity of detection at the edge of the semiconductor substrate when the surface of the semiconductor substrate is contaminated with the metal, the edge portions #11 and #12 of the semiconductor were contaminated, as is exemplarily shown in FIG. 4. In addition, a p-type wafer doped with boron (B) was used as the semiconductor substrate. However, the following description may also be applied to the case in which the semiconductor substrate is an n-type wafer. In particular, PL intensity in the case in which the semiconductor substrate is an n-type wafer may be superior to PL intensity in the case in which the semiconductor substrate is a p-type wafer. In addition, the temperature of the dry oxidation process was changed to 950° C., 1000° C., and 1050° C., and the process time at each temperature was changed to 30 minutes and 60 minutes.

Figure 13:
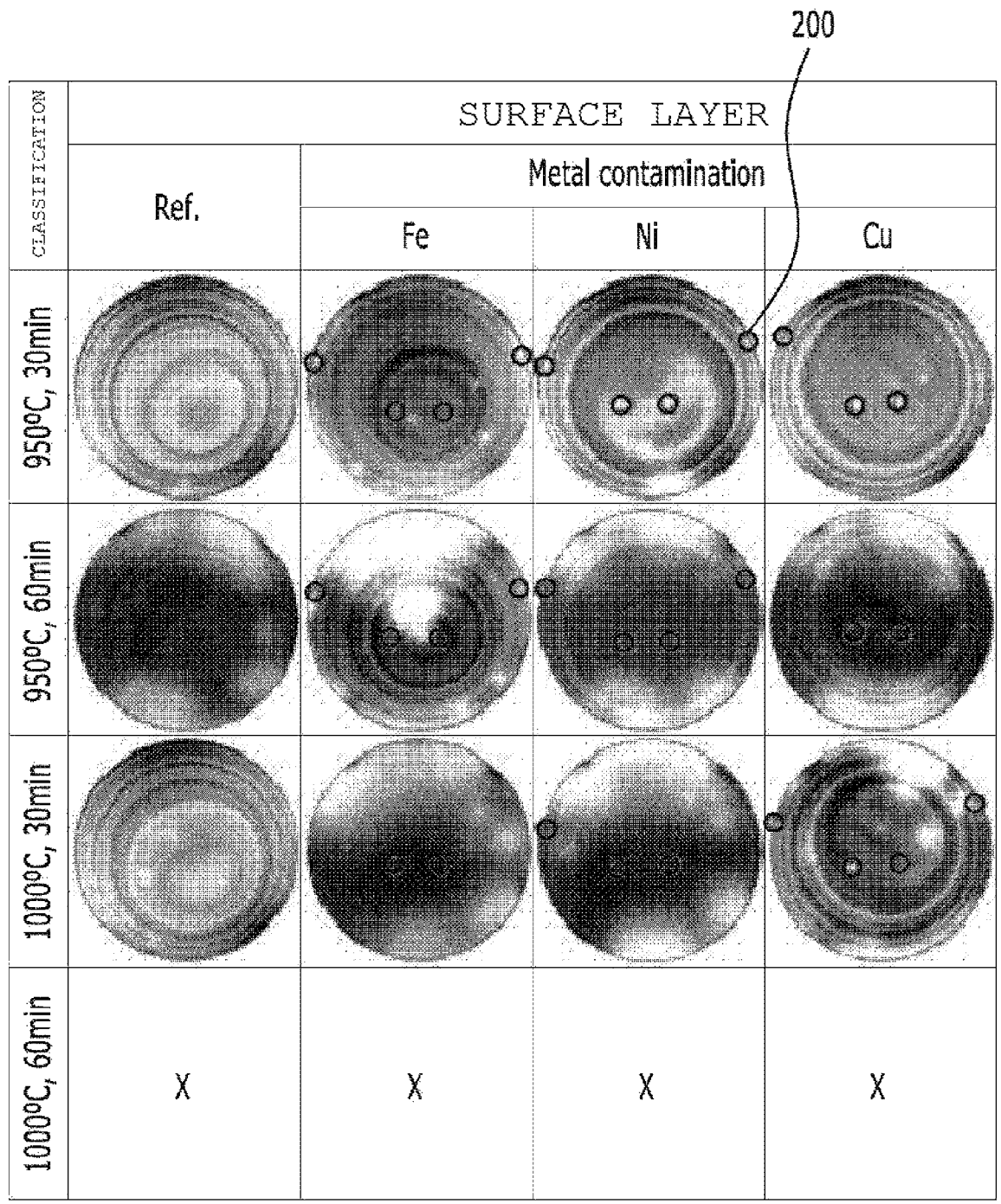
FIG. 13 shows a PL map evaluating metal contamination of a surface layer of a heavily-doped semiconductor substrate by respective metal contamination materials depending on variation in the temperature and time of a dry oxidation process.

FIG. 13 shows a PL map evaluating metal contamination of a surface layer of a heavily-doped semiconductor substrate by respective metal contamination materials (Fe, Ni, and Cu) depending on variation in the temperature and time of the dry oxidation process. Here, small circles 200 indicate contaminated portions.

Figure 14:
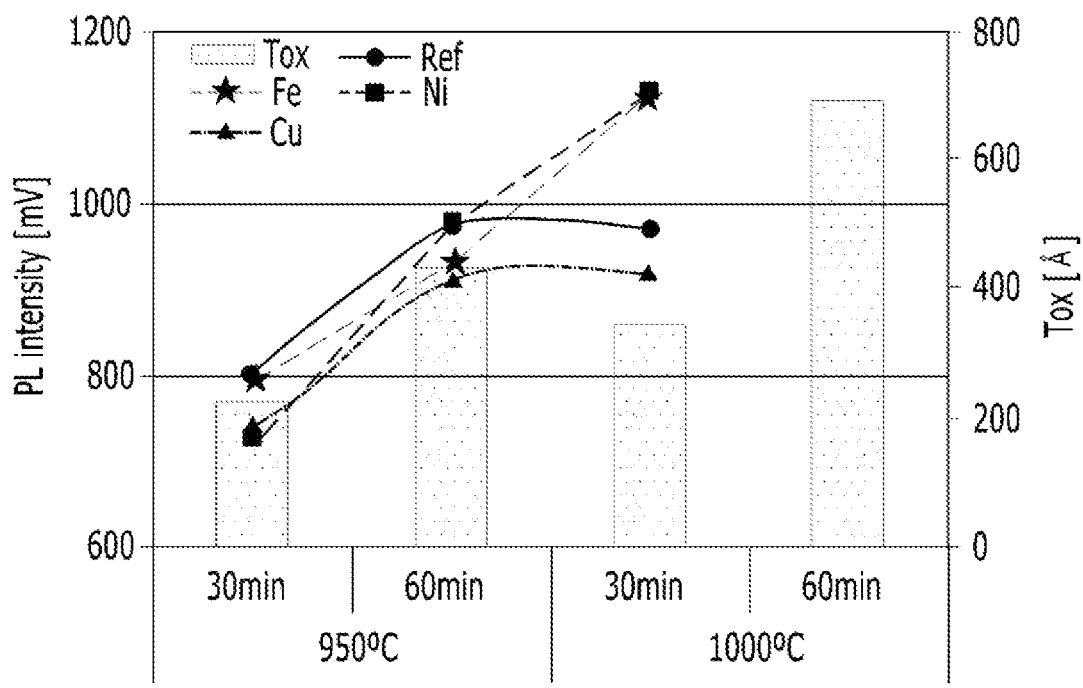
FIG. 14 is a graph showing variation in the thickness of the oxide film depending on variation in the temperature and time of the dry oxidation process and PL intensity at the surface layer of the heavily-doped semiconductor substrate by respective metal contamination materials.

FIG. 14 is a graph showing variation in the thickness of the oxide film depending on variation in the temperature and time of the dry oxidation process and PL intensity at the surface layer of the heavily-doped semiconductor substrate by respective metal contamination materials.

FIGS. 13 and 14 show the results acquired in the case in which the wavelength of excitation light radiated to the surface layer is 532 nm and the surface layer is the first area A1 from the surface t0 to the first depth t1 of the semiconductor substrate, which is spaced apart from the surface t0 by 1 μm. In FIGS. 13 and 14, "Ref" indicates the case in which the semiconductor substrate is not contaminated with the metal, as shown in Table 1.

Referring to FIG. 13, it can be seen that, when the temperature and time of the dry oxidation process are 1000° C. and 60 minutes, PL measurement is not possible. Referring to FIG. 14, it can be seen that, in the cases excluding the case in which the temperature and time of the dry oxidation process are 1000° C. and 30 minutes, PL intensity increases as the thickness Tox of the oxide film increases, irrespective of the kind of the metal.

Particularly, referring to FIG. 14, in the case in which the semiconductor substrate is a heavily-doped wafer and the surface layer of the semiconductor substrate is evaluated at step 130, dry oxidation may be performed at a process temperature of 950° C. for respective process times of 30 minutes and 60 minutes or at a process temperature of 1000° C. for a process time of 30 minutes in order to form an oxide film having a thickness of 200 Å to 500 Å, whereby PL intensity is acquired.

Figure 15:
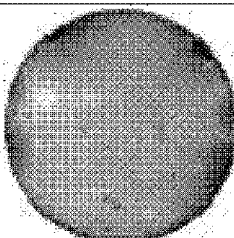
FIG. 15 shows a PL map evaluating metal contamination of a surface layer of a lightly-doped semiconductor substrate by respective metal contamination materials depending on variation in the temperature and time of the dry oxidation process.

FIG. 15 shows a PL map evaluating metal contamination of a surface layer of a lightly-doped semiconductor substrate by respective metal contamination materials (Fe, Ni, and Cu) depending on variation in the temperature and time of the dry oxidation process. Here, small circles 202 indicate contaminated portions.

Figure 16:
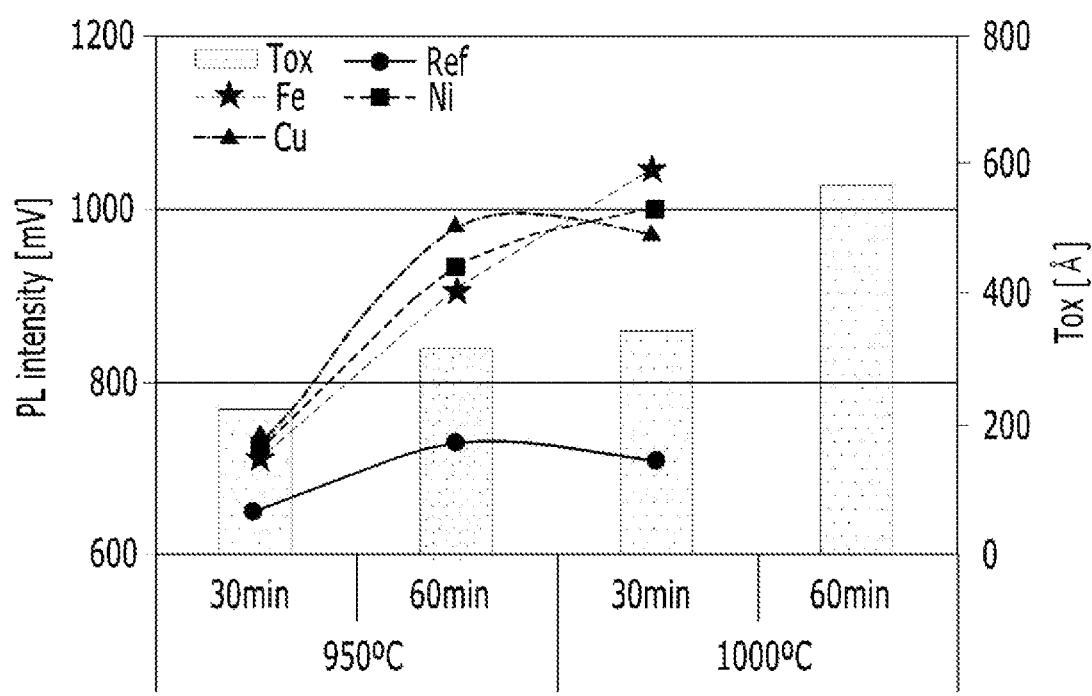
FIG. 16 is a graph showing variation in the thickness of the oxide film depending on variation in the temperature and time of the dry oxidation process and PL intensity at the surface layer of the lightly-doped semiconductor substrate by metal contamination materials.

FIG. 16 is a graph showing variation in the thickness of the oxide film depending on variation in the temperature and time of the dry oxidation process and PL intensity at the surface layer of the lightly-doped semiconductor substrate by metal contamination material.

FIGS. 15 and 16 show the results acquired in the case in which the wavelength of excitation light radiated to the surface layer is 532 nm and the surface layer is the first area A1 from the surface t0 to the first depth t1 of the semiconductor substrate, which is spaced apart from the surface t0 by 1 μm. In FIGS. 15 and 16, "Ref" indicates the case in which the semiconductor substrate is not contaminated with the metal, as shown in Table 1.

Referring to FIG. 15, it can be seen that, when the temperature and time of the dry oxidation process are 1000° C. and 60 minutes, PL measurement is not possible. Referring to FIG. 16, it can be seen that, in cases excluding the case in which the temperature and time of the dry oxidation process are 1000° C. and 30 minutes, PL intensity increases as the thickness Tox of the oxide film increases, irrespective of the kind of the metal.

Referring to FIG. 16, in the case in which the semiconductor substrate is a lightly-doped wafer and the surface of the semiconductor substrate is evaluated at step 130, dry oxidation may be performed at respective process temperatures of 950° C. and 1000° C. for respective process times of 30 minutes and 60 minutes in order to form an oxide film having a thickness of 200 Å to 600 Å, whereby PL intensity is determined. For example, the dry oxidation may be performed at a temperature of 950° C. for 30 minutes. However, embodiments are not limited thereto.

Hereinafter, in the case in which the temperature and time of the dry oxidation process were 1000° C. and 60 minutes or longer after the semiconductor substrate was contaminated with the metal, precipitation was generated. Consequently, the dry oxidation process was performed at temperatures of 950° C. and 1000° C. for 30 minutes, during which no precipitation was generated, in the state in which the thickness of the oxide film was uniform in order to evaluate contamination of the bulk layer as follows. At this time, excitation light having a wavelength of 827 nm was radiated to the semiconductor substrate using a laser light source, and the semiconductor substrate was evaluated in the case (P+) in which the semiconductor substrate was heavily doped with boron and in the case (P−) in which the semiconductor substrate was lightly doped with boron. However, embodiments are not limited thereto. That is, the following description may also be applied to the case in which the semiconductor substrate is an n-type wafer. In particular, PL intensity in the case in which the semiconductor substrate is an n-type wafer may be superior.

Figure 17:
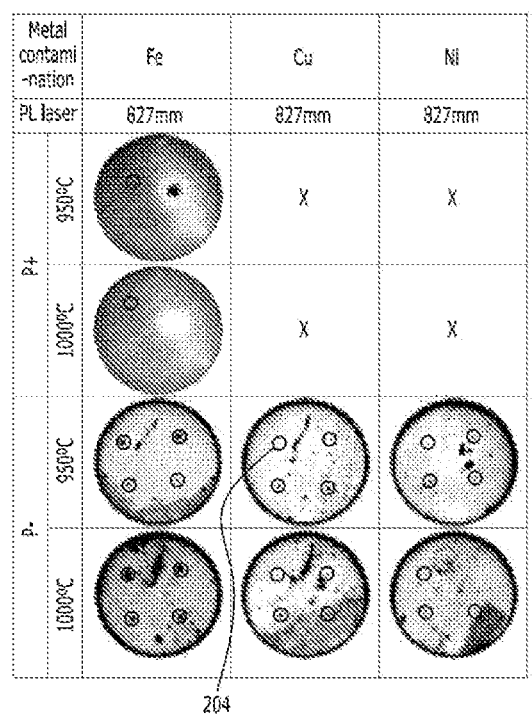
FIG. 17 shows a PL map evaluating metal contamination of a bulk layer of each of a heavily-doped semiconductor substrate and a lightly-doped semiconductor layer by respective metal contamination materials when the dry oxidation process temperatures are 950° C. and 1000° C. and the process time is 30 minutes.

FIG. 17 shows a PL map evaluating metal contamination of a bulk layer of each of a heavily-doped semiconductor substrate (P+) and a lightly-doped semiconductor substrate by respective metal contamination materials (Fe, Ni, and Cu) when the dry oxidation process temperatures are 950° C. and 1000° C. and the process time is 30 minutes. Here, small circles 204 indicate contaminated portions.

Referring to FIG. 17, it can be seen that metal contamination is detected irrespective of the kind of the metals (Fe, Ni, and Cu) in the case (P−) in which the semiconductor substrate is lightly doped. Particularly, it can be seen that metal contamination detection power in the case in which the process temperature is 950° C. and the process time is 30 minutes is higher than that in the case in which the process temperature is 1000° C. and the process time is 30 minutes, and no precipitation is generated in the case in which the process temperature is 950° C. and the process time is 30 minutes.

In contrast, referring to FIG. 17, it can be seen that, in the case in which the semiconductor substrate is a heavily-doped wafer (P+) and the bulk layer of the semiconductor substrate is evaluated at step S130, it is possible to detect only Fe contamination at the bulk layer of the semiconductor substrate when dry oxidation is performed at a process temperature of 950° C. for 30 minutes in order to form an oxide film.

Figure 18A:
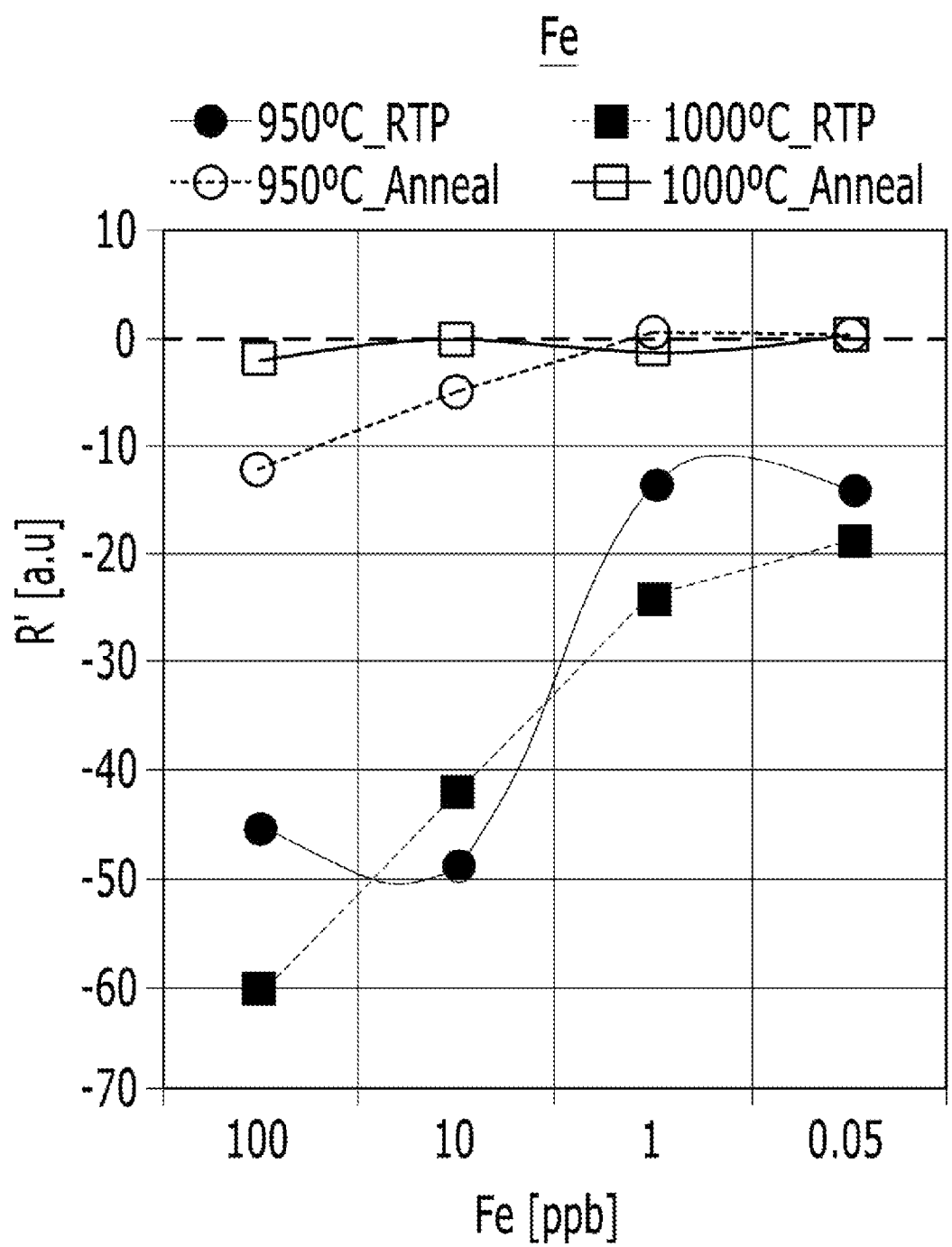
FIGS. 18a to 18c show the metal contamination levels of Fe, Cu, and Ni and a PL intensity rate by oxide film process conditions depending on the contamination levels, in the case in which the semiconductor substrate is a p-type lightly-doped wafer.
Figure 18B:
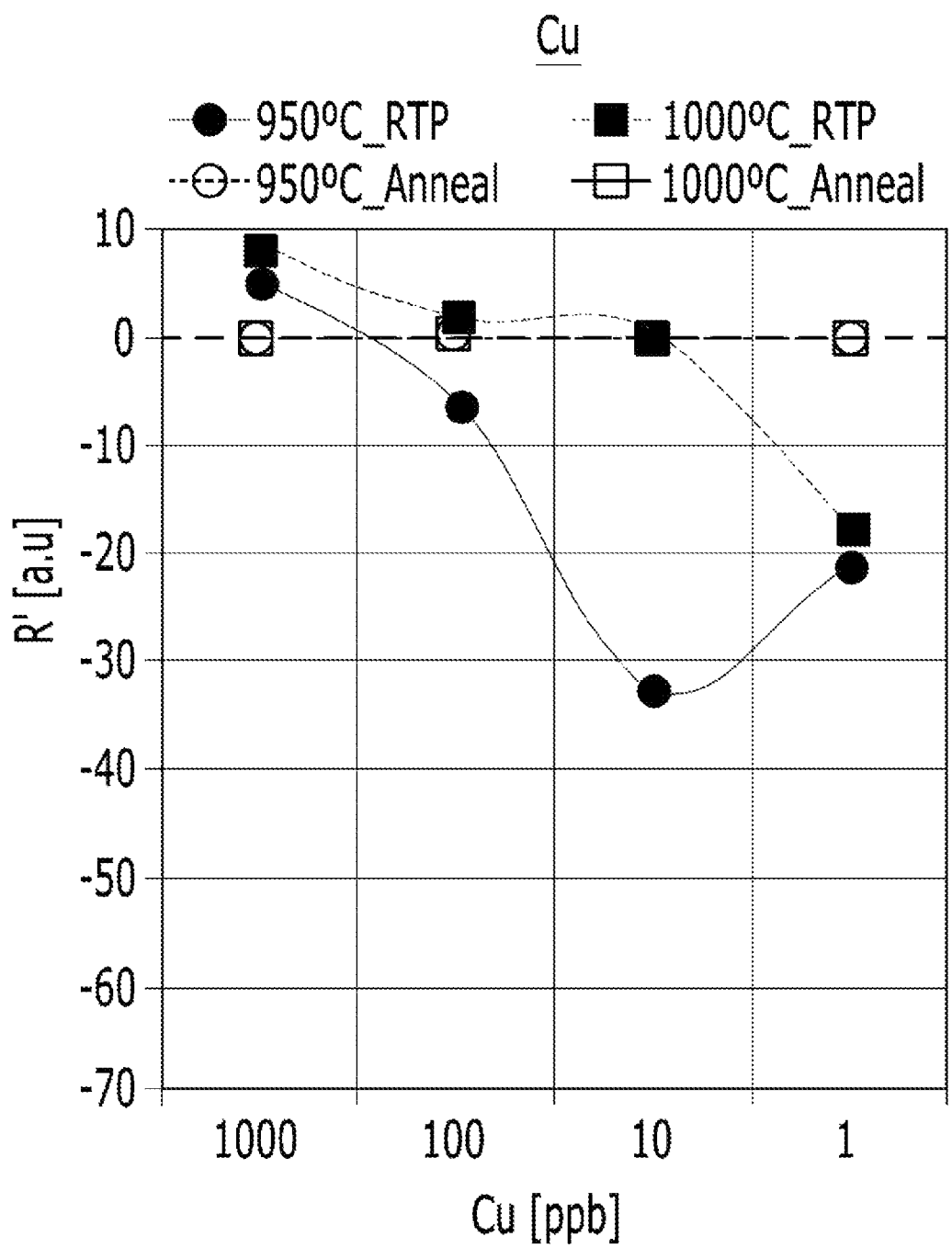
Figure 18C:
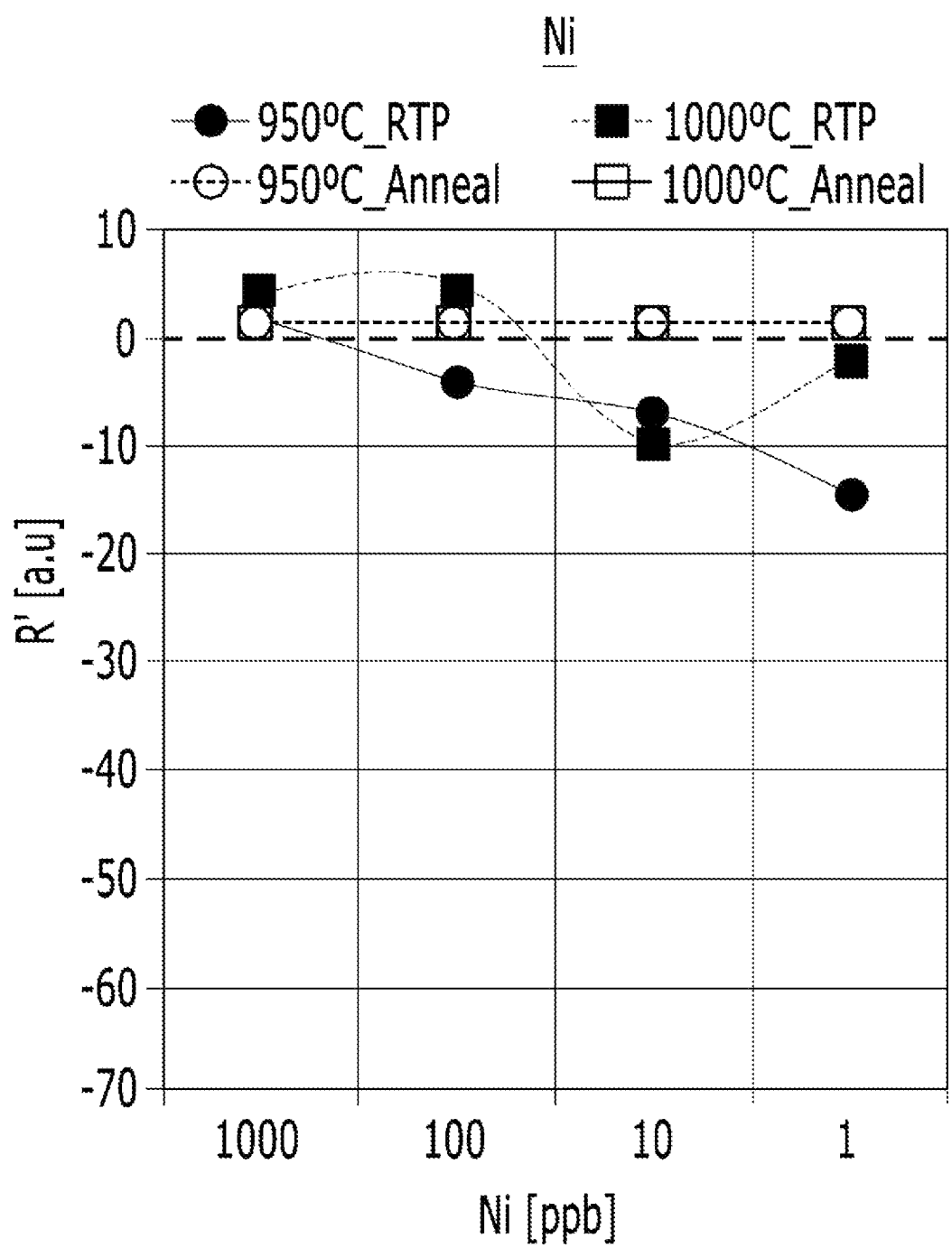

FIGS. 18a to 18c show the metal contamination levels of Fe, Cu, and Ni and a PL intensity rate R' by oxide film process conditions depending on the contamination levels, in the case in which the semiconductor substrate is a p-type lightly-doped wafer. Here, RTP indicates rapid thermal processing. FIGS. 18a to 18c show the results measured when the wavelength of excitation light is 532 nm.

The rate R', which is the vertical axis in each of FIGS. 18a to 18c, may be expressed using Equation 2 below.

$$R' = \frac{I_D - I_N}{I_N} \qquad \text{Equation 2}$$

Here, ID indicates PL intensity at each metal contamination point, and IN indicates PL intensity over the entire semiconductor substrate.

In addition, after step 130, at least one of whether metal contamination is present in the semiconductor substrate or the degree of metal contamination may be evaluated using microwave photoconductive decay (μ-PCD) (step 140). In the case in which the semiconductor substrate is evaluated using oxidized passivation minority carrier lifetime (OP-MCLT), which is an example of μ-PCD, it is possible to evaluate a lightly-doped semiconductor substrate but it is not possible to evaluate a heavily-doped semiconductor substrate.

After step 140, correlation between a first evaluation result using the PL evaluation method and a second evaluation result using the μ-PCD, for example, OP-MCLT, may be checked (step 150). Step 150 may be performed in order to estimate the accuracy of the first evaluation result using the PL evaluation method.

Figure 19A:
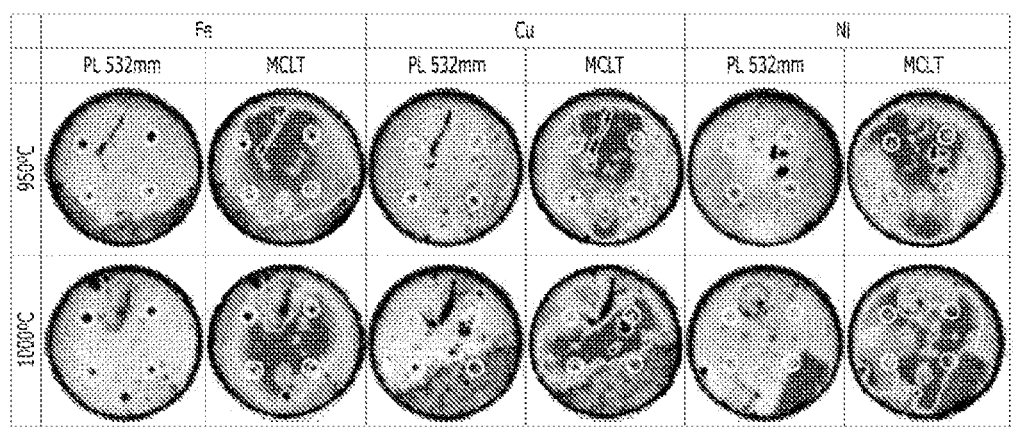
Figure 19B:
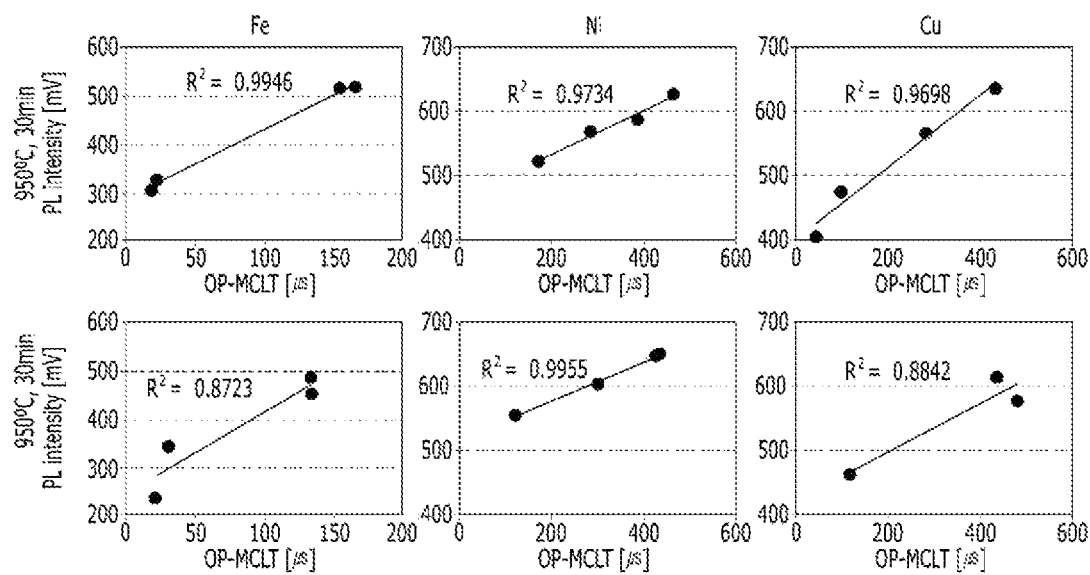
FIG. 19b is a graph showing the comparison of correlation between the first evaluation result and the second evaluation result.

FIG. 19a is a map showing correlation between the first evaluation result and the second evaluation result while FIG. 19b is a graph showing the comparison of correlation between the first evaluation result and the second evaluation result. In FIG. 19b. "$R^2$" means the coefficient of correlation between "PL Intensity" and "OP-MCLT." Here, Fe, Cu, and Ni are metal contamination materials, "PL 532 nm" indicates the first evaluation result obtained by radiating excitation light having a wavelength of 532 nm to the semiconductor substrate and evaluating the surface layer of the semiconductor substrate using the PL evaluation method, and MCLT indicates the second evaluation result obtained by evaluating the semiconductor substrate using OP-MCLT.

In the case in which dry oxidation is performed at 950° C. for 30 minutes in order to forcibly form an oxide film, as shown in FIGS. 19a and 19b, when the semiconductor substrate is a p-type wafer lightly doped with boron and the semiconductor substrate is contaminated with the metal (Fe, Cu, or Ni), it is possible to verify, based on the first evaluation result, that contamination of both the surface layer and the bulk layer is detected well. In the case of Fe and Ni, it can be seen that the correlation R2 between the first evaluation result and the second evaluation result is 97% or higher, which is very high.

Generally, in the case in which a semiconductor substrate, such as a single crystalline silicon wafer, is evaluated using the PL evaluation method, the loss of recombination at the surface of the semiconductor substrate occurs depending on the state of the surface of the substrate due to external contamination of the semiconductor substrate and processing of the semiconductor substrate, whereby the sensitivity of light detected using the PL evaluation method may be reduced. That is, the light detected using the PL evaluation method may fluctuate.

In contrast, according to this embodiment, an oxide film is forcibly formed on the surface of the semiconductor substrate as a pretreatment step before the semiconductor substrate is evaluated using the PL evaluation method, and then the semiconductor substrate is evaluated using the PL evaluation method. As a result, the speed of recombination at the surface of the semiconductor substrate is controlled so as to be slow by the oxide film so that the speed of recombination is suppressed. Consequently, the PL intensity of the semiconductor substrate used in the PL evaluation method at room temperature is improved, whereby it is possible to easily and accurately measure actual metal contamination in the semiconductor substrate.

In addition, generally, in the case in which the semiconductor substrate is heavily doped, for example, in the case in which the semiconductor substrate is heavily doped with boron (B) dopant, the sensitivity of light detected in the PL evaluation method based on boron striation, i.e. PL intensity, is very great due to scattering caused by the dopant. Even in the case in which metal contamination is present in the semiconductor substrate, therefore, it may be difficult to detect the metal contamination. Here, "boron striation" means a concentric pattern.

In contrast, according to this embodiment, in the case in which the semiconductor substrate is heavily doped as well as in the case in which the semiconductor substrate is lightly doped, dry oxidation is performed under optimized conditions, for example, at a temperature of 950° C. for 30 minutes, in order to form the oxide film, whereby it is possible to easily and accurately detect whether metal contamination is present at the surface layer and the bulk layer and the degree of metal contamination, i.e. it is possible to increase detection power.

In addition, correlation between the result of evaluation using the PL evaluation method and the result of evaluation using the μ-PCD method may be checked, as previously described, in order to provide the degree of correlation between electrical property evaluation instruments, whereby it is possible to guarantee reliability in the evaluation result of the semiconductor substrate using the PL evaluation method.

Although embodiments have been described with reference to a number of illustrative embodiments thereof, it should be understood that the embodiments are illustrative and not restrictive, and that numerous other modifications and applications may be devised by those skilled in the art that will fall within the intrinsic aspects of the embodiments. For example, various variations and modifications are possible in concrete constituent elements of the embodiments. In addition, it is to be understood that differences relevant to such variations and modifications fall within the spirit and scope of the present disclosure, which is defined in the appended claims.

MODE FOR INVENTION

Various embodiments have been described in the best mode for carrying out the invention.

INDUSTRIAL APPLICABILITY

A semiconductor substrate manufacturing method according to an embodiment may be used in the semiconductor substrate manufacturing field.

The invention claimed is:

1. A semiconductor substrate manufacturing method comprising:
    (a) contaminating at least one of a surface layer or a bulk layer, which is located under the surface layer, of a doped semiconductor substrate having a specific resistance of 0.1 Ω·cm or less with at least one metal of Fe, Cu, or Ni;
    (b) performing dry oxidation at a temperature of 950° C. for 30 minutes in order to forcibly form an oxide film on a surface of the semiconductor substrate; and
    (c) evaluating at least one of whether metal contamination is present in at least one of the surface layer, on which the oxide film is formed, or the bulk layer or a degree of metal contamination using a photoluminescence evaluation method.

2. The semiconductor substrate manufacturing method according to claim 1, wherein the specific resistance of the semiconductor substrate to be contaminated with the metal at the step (a) is 0.005 Ω·cm to 0.02 Ω·cm.

3. The semiconductor substrate manufacturing method according to claim 1, wherein the semiconductor substrate to be contaminated with the metal at the step (a) comprises a polished wafer, which is formed by mirror surface grinding, or an epitaxial wafer, which has an epitaxial layer formed on the polished wafer.

4. The semiconductor substrate manufacturing method according to claim 1, wherein the semiconductor substrate to be contaminated with the metal at the step (a) comprises a single crystalline silicon wafer, a polycrystalline silicon wafer, or a compound semiconductor wafer.

5. The semiconductor substrate manufacturing method according to claim 1, wherein the semiconductor substrate to be contaminated with the metal at the step (a) is an n-type doped substrate.

6. The semiconductor substrate manufacturing method according to claim 1, wherein the step (a) contaminating the surface layer with the metal comprises contaminating at least two points, located at an edge of the semiconductor substrate so as to be spaced apart from each other, and at least two points, located at a central portion of the semiconductor substrate inside the edge thereof so as to be spaced apart from each other, with the metal.

7. The semiconductor substrate manufacturing method according to claim 1, wherein the step (a) contaminating the bulk layer with the metal comprises:
    contaminating a plurality of points located at a surface of a central portion of the semiconductor substrate inside an edge thereof so as to be spaced apart from each other with the metal;
    performing diffusion heat treatment in order to diffuse the metal contaminant, present at the surface, into a bulk of the semiconductor substrate; and
    polishing the surface of the semiconductor substrate after the diffusion.

8. The semiconductor substrate manufacturing method according to claim 1, wherein the step (b) is performed after removing a natural oxide film formed on the surface of the semiconductor substrate.

9. The semiconductor substrate manufacturing method according to claim 1, wherein the step (b) is performed in a state in which a natural oxide film is formed on the surface of the semiconductor substrate.

10. The semiconductor substrate manufacturing method according to claim 1, wherein
    the oxide film is formed so as to have a thickness of 200 Å to 500 Å at the step (b), and
    the surface layer of the semiconductor substrate is evaluated at the step (c).

11. The semiconductor substrate manufacturing method according to claim 1, wherein Fe contamination in the bulk layer of the semiconductor substrate is evaluated at the step (c).

12. The semiconductor substrate manufacturing method according to claim 1, wherein, at the step (c),
    a wavelength of excitation light radiated to the semiconductor substrate in order to evaluate the surface layer is 532 nm, and
    a wavelength of excitation light radiated to the semiconductor substrate in order to evaluate the bulk layer is 827 nm.

13. The semiconductor substrate manufacturing method according to claim 1, wherein
    the surface layer is a first area from the surface to a depth of the semiconductor substrate spaced apart from the surface by 1 μm, and
    the bulk layer is a second area from the surface to a depth of the semiconductor substrate spaced apart from the surface by 10 μm to 30 μm.

* * * * *